(12) United States Patent
Shen et al.

(10) Patent No.: US 10,037,951 B2
(45) Date of Patent: Jul. 31, 2018

(54) SEMICONDUCTOR PACKAGE WITH ANTENNA

(71) Applicant: CYNTEC CO., LTD., Hsinchu (TW)

(72) Inventors: Chia-Hsien Shen, New Taipei (TW); Kuan-Chih Huang, Chiayi County (TW); Shu-Wei Chang, New Taipei (TW); Joseph D. S. Deng, Taoyuan (TW)

(73) Assignee: CYNTEC CO., LTD., Hsinchu (TW)

( * ) Notice: Subject to any disclaimer, the term of this patent is extended or adjusted under 35 U.S.C. 154(b) by 0 days.

(21) Appl. No.: 15/363,652

(22) Filed: Nov. 29, 2016

(65) Prior Publication Data
US 2018/0151518 A1 May 31, 2018

(51) Int. Cl.
| | |
|---|---|
| H01L 23/66 | (2006.01) |
| H01L 23/31 | (2006.01) |
| H01L 23/552 | (2006.01) |
| H01L 23/00 | (2006.01) |
| H01L 23/498 | (2006.01) |
| H01L 21/56 | (2006.01) |
| H01L 21/683 | (2006.01) |

(52) U.S. Cl.
CPC ............ *H01L 23/66* (2013.01); *H01L 21/565* (2013.01); *H01L 21/6835* (2013.01); *H01L 23/3121* (2013.01); *H01L 23/49838* (2013.01); *H01L 23/552* (2013.01); *H01L 24/17* (2013.01); *H01L 24/81* (2013.01); *H01L 2221/68359* (2013.01); *H01L 2223/6677* (2013.01); *H01L 2224/16225* (2013.01); *H01L 2924/19105* (2013.01); *H01L 2924/3025* (2013.01)

(58) Field of Classification Search
CPC .............................. H01L 23/66; H01L 23/552
See application file for complete search history.

(56) References Cited

U.S. PATENT DOCUMENTS

| | | | | |
|---|---|---|---|---|
| 6,597,902 | B1* | 7/2003 | Kawano | H01L 23/66 |
| | | | | 455/347 |
| 9,419,667 | B2* | 8/2016 | Lobianco | H04B 1/3838 |
| 9,633,239 | B2* | 4/2017 | Dabrowski | G06K 7/10198 |
| 2005/0245001 | A1* | 11/2005 | Hyvonen | H01L 23/5389 |
| | | | | 438/107 |
| 2005/0253664 | A1* | 11/2005 | Hyvonen | H01Q 9/0421 |
| | | | | 333/101 |
| 2006/0067070 | A1* | 3/2006 | Otsuki | H01L 23/5387 |
| | | | | 361/816 |
| 2007/0188384 | A1* | 8/2007 | Liu | H01Q 1/526 |
| | | | | 343/700 MS |

(Continued)

*Primary Examiner* — Michele Fan
(74) *Attorney, Agent, or Firm* — Birch, Stewart, Kolasch & Birch, LLP

(57) ABSTRACT

A semiconductor package includes a radio frequency (RF) module, an antenna, an electromagnetic (EM) shield and a first mold body. The RF module having a bottom and a lateral side, wherein the RF module includes a module board at the bottom. The antenna located at the lateral side of the RF module. The EM shield covering the RF module, wherein the EM shield includes a side wall disposed along the lateral side of the RF module, and the side wall of the EM shield is between the RF module and the antenna. The first mold body fixing the EM shield and the antenna, such that the antenna is spaced apart from the side wall of the EM shield by a predetermined distance.

19 Claims, 11 Drawing Sheets

(56) References Cited

U.S. PATENT DOCUMENTS

| | | | |
|---|---|---|---|
| 2010/0230789 A1* | 9/2010 | Yorita | H01L 23/3121 257/659 |
| 2011/0275181 A1* | 11/2011 | Kang | G06K 19/07749 438/127 |
| 2013/0057452 A1* | 3/2013 | Watanabe | H05K 1/114 343/905 |
| 2015/0364829 A1* | 12/2015 | Tong | H01Q 19/10 342/175 |
| 2016/0149300 A1* | 5/2016 | Ito | H01Q 23/00 343/841 |
| 2016/0218072 A1* | 7/2016 | Liao | H01L 23/66 |
| 2016/0218420 A1* | 7/2016 | Leung | H01Q 1/3233 |

* cited by examiner

SEMICONDUCTOR PACKAGE WITH ANTENNA

CROSS REFERENCE TO RELATED APPLICATIONS

None

BACKGROUND OF THE INVENTION

1. Field of the Invention

The present invention relates to a semiconductor package, and more particularly to a semiconductor package with antenna.

2. Description of the Related Art

Wireless communication devices, such as wearable point-of-sale (POS) terminals, require antennas and a wireless function circuit with a plurality of wireless components (for example, a wireless IC with RF communication capability) for processing, transmitting and receiving RF signals. Conventionally, a wireless communication device includes an antenna and a wireless function circuit respectively disposed on different parts of a system circuit board, and the antenna and the wireless function circuit are separately manufactured and electrically connected to each other after being placed on the system circuit board. Since they are separately manufactured, higher manufacturing costs are incurred, and it is difficult to achieve a compact product design.

Furthermore, since RF signals are high-frequency signals, electromagnetic interference (EMI) or local oscillator (LO) leakage may easily occur. EMI or LO leakage may interrupt, obstruct or otherwise degrade or limit the performance of the circuit. As is known in the art, EMI protection can be achieved by using an EMI shielding frame covering the system circuit board. LO leakage, on the other hand, can be reduced by adjusting isolation between the antenna and the wireless function circuit. For example, the isolation can be improved by optimizing the distance between the antenna and the wireless function circuit including a baseband IC.

Therefore, wireless communication devices design must take the arrangement of the antenna and wireless components of the wireless function circuit into consideration. However, the wireless function circuit is not formed as a module or package, and plural wireless components of the wireless function circuit are designed to be disposed on the system circuit board. It is difficult to consider the layout/arrangement of the antenna and each wireless component respectively every time. Thus, to provide a semiconductor package that can act as a package component and can also be easily applied to a system circuit board of any wireless communication device with LO leakage would be desired.

SUMMARY OF THE INVENTION

In accordance with an aspect of the present invention, a semiconductor package, comprises: a radio frequency (RF) module having a bottom and a lateral side, wherein the RF module includes a module board at the bottom; an antenna located at the lateral side of the RF module; an electromagnetic (EM) shield covering the RF module, wherein the EM shield includes a side wall disposed along the lateral side of the RF module, and the side wall of the EM shield is between the RF module and the antenna; and a first mold body fixing the EM shield and the antenna such that the antenna is spaced apart from the side wall of the EM shield by a predetermined distance.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION

Figure 1A:
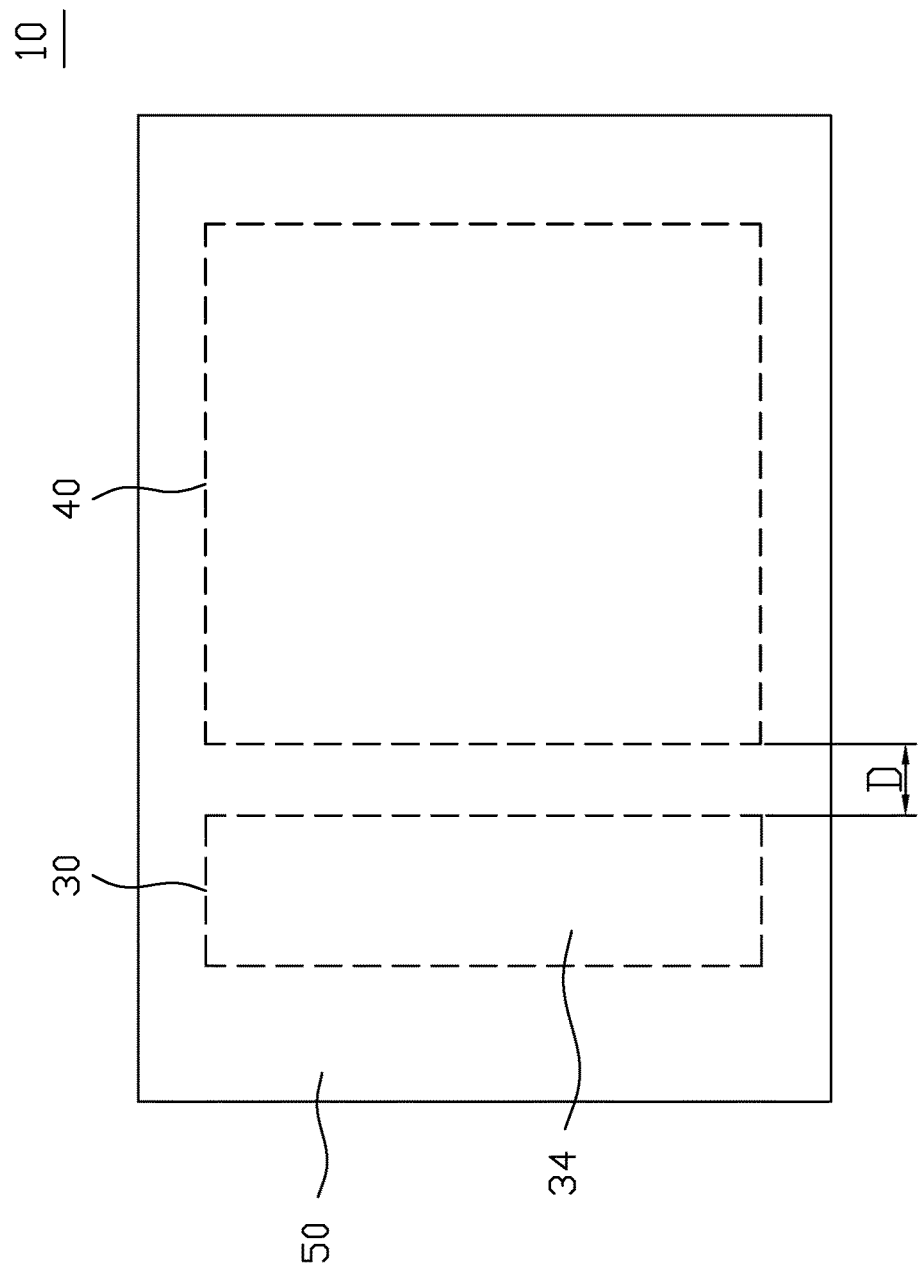
FIG. 1A is a top view showing a structure of a semiconductor package to a first embodiment of the present invention.

The present invention will now be described in detail with reference to the accompanying drawings, wherein the same reference numerals will be used to identify the same or similar elements throughout the several views. It should be noted that the drawings should be viewed in the direction of orientation of the reference numerals.

Figure 1B:
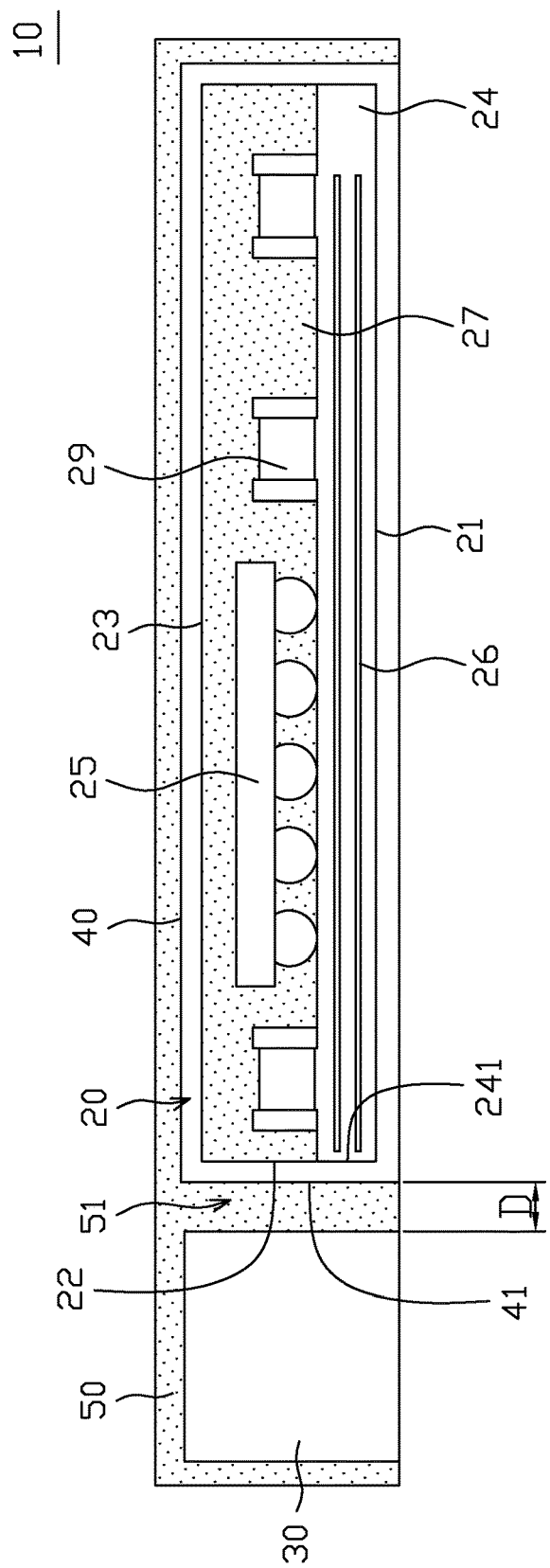
FIG. 1B is a cross-sectional view showing a structure of a semiconductor package according to the first embodiment of the present invention.
Figure 1C:
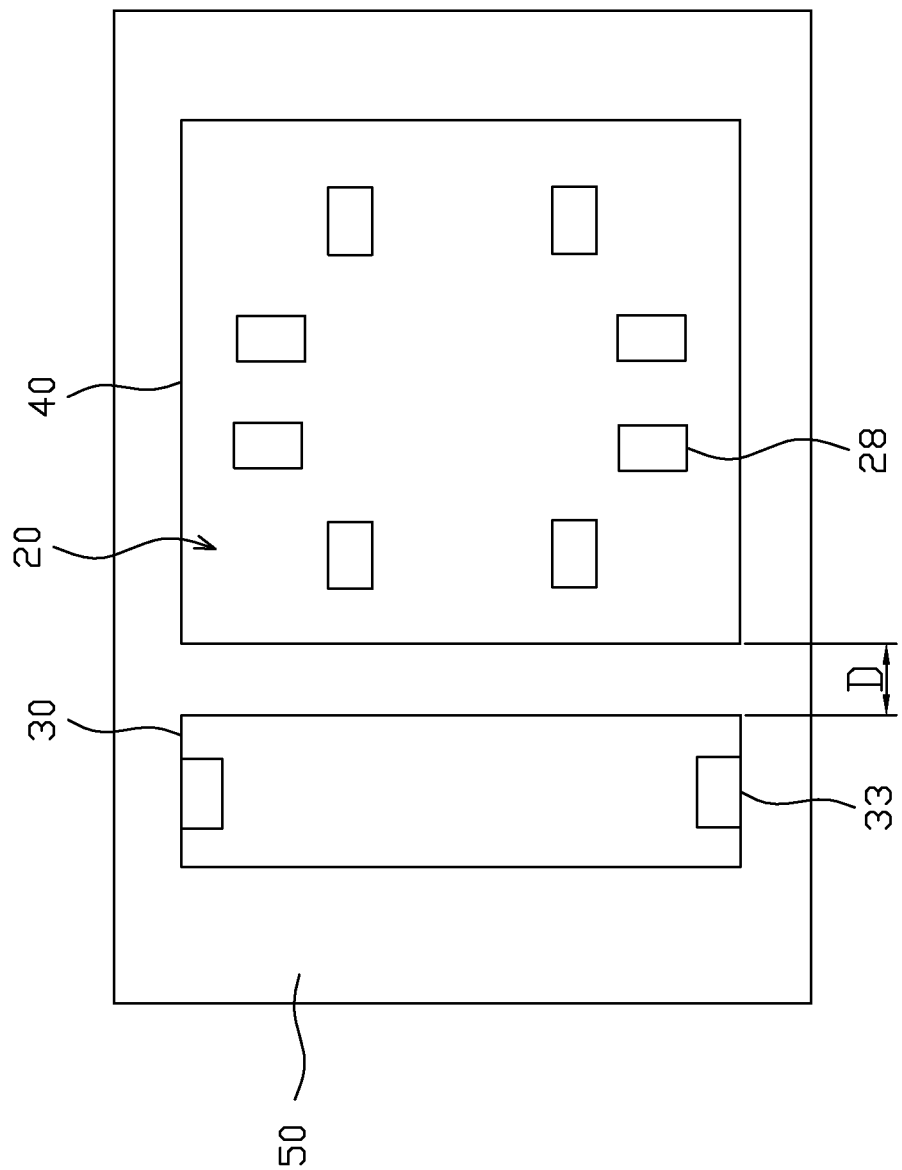
FIG. 1C is a bottom view showing a structure of a semiconductor package to the first embodiment of the present invention.
Figure 2:
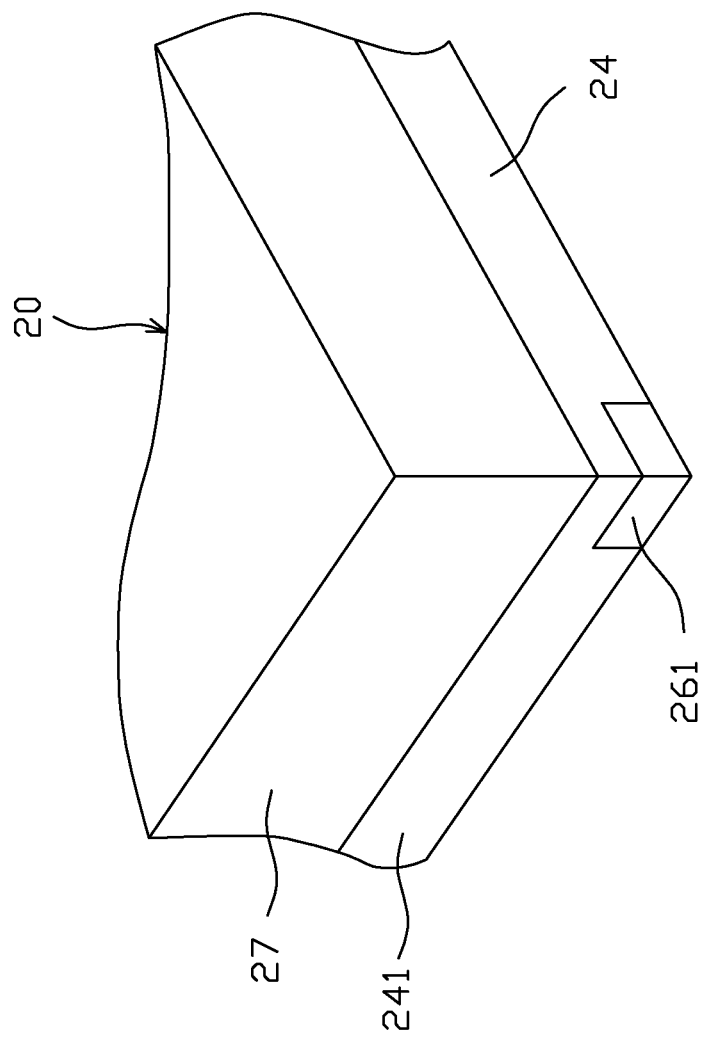
FIG. 2 is a diagram showing an electronically connecting structure according to the first embodiment of the present invention.

FIG. 1A is a top view showing a structure of a semiconductor package to a first embodiment of the present invention. FIG. 1B is a cross-sectional view showing a structure of a semiconductor package according to the first embodiment of the present invention. FIG. 1C is a bottom view showing a structure of a semiconductor package to the first embodiment of the present invention. FIG. 2 is a diagram showing an electronically connecting structure according to the first embodiment of the present invention. As shown in FIGS. 1A, 1B and 1C, the semiconductor package 10 includes a radio frequency (RF) module 20, an antenna 30, an electromagnetic (EM) shield 40 and a first mold body 50.

The RF module 20 includes a bottom 21, a top surface 23 facing away from the bottom 21, and a lateral side 22. The RF module 20 further includes a module board 24 at the bottom 21. In an embodiment, the module board 24 includes a side surface 241, and the side surface 241 of the module board 24 is along the lateral side 22 of the RF module 20. In an embodiment, the RF module 20 further includes a semiconductor component 25, at least one surface mount device (SMD) component 29, a second mold body 27 and a ground layer 26. The semiconductor component 25 and the SMD component 29 are disposed on the module board 24. For example, the semiconductor component 25 is a baseband IC and forms a wireless function circuit with other components (not shown) on the module board 24, and there are a plurality of SMD components 29 on the module board 24. In some embodiments, the SMD components 29 can be a resistor, a capacitor, an inductor, a filter, a diplexer, a triplexer or a balun, conductive component such as copper, and/or a combination thereof. In an embodiment, the second mold body 27, such as an epoxy mold compound, is disposed on the module board 24 and covers the semiconductor component 25 and the SMD component 29. In an embodiment, the ground layer 26 is disposed in the module board 24 and can extend along the module board 24 according to different requirements of grounding.

In an embodiment, the antenna 30 is located at the lateral side 22 of the RF module 20 and includes a patterned portion 34. In some embodiments, the patterned portion 34 of the antenna 30 can be a monopole type, PFIA type, F-type, U-type or strip line type. In an embodiment, the antenna 30 and the RF module 20 do not overlap with each other at the lateral side 22 of the RF module 20 from a top view of the semiconductor package 10.

The EM shield 40 covers the RF module 20. In an embodiment, the EM shield 40 can be made of a conducting material(s) or a ferromagnetic material(s), such as copper, aluminum, other metal material, paste, ferrite, etc. The EM shield 40 includes a side wall 41, and the side wall 41 is disposed along the lateral side 22 of the RF module 20 and between the antenna 30 and the RF module 20. In an embodiment, the side wall 41 of the EM shield 40 along the lateral side 22 of the RF module 20 extends to the module board 24, and the side wall 41 of the EM shield 40 covers the side surface 241 of the module board 24. In an embodiment, the side wall 41 of the EM shield 40 can form an electronic connection with the ground layer 26 by way of the side surface 241 of the module board 24. For example, as shown in FIG. 2, the ground layer 26 includes an electronically connecting structure 261 at the side surface 241 of the module board 24, the electronically connecting structure 261 is exposed to the side surface 241 of the module board 24, and the side wall 41 of EM shield 40 contacts the electronically connecting structure 261 at the side surface 241 of the module board 24 to form the electronic connection. In an embodiment, the EM shield 40 covers the top surface 23 of the RF module 20.

In an embodiment, the first mold body 50 fixes the EM shield 40 and the antenna 30 such that the antenna 30 is spaced apart from the side wall 41 of the EM shield 40 by a predetermined distance D. In an embodiment, the first mold body 50 includes a spacer 51 located between the side wall 41 of the EM shield 40 and the antenna 30, and the spacer 51 connects the side wall 41 of the EM shield 40 and the antenna 30 respectively to fix the side wall 41 of the EM shield 40 and the antenna 30. Therefore, the antenna 30 is spaced apart from the side wall 41 of the EM shield 40 by the spacer 51, and the spacer 51 defines the predetermined distance D. In an embodiment, the length of predetermined distance D is predetermined according the operation requirements between the antenna 30 and the RF module 20. Furthermore, in an embodiment, the first mold body 50 can cover the antenna 30 and the EM shield 40, and the material of the first mold body 50 can be an epoxy mold compound.

Figure 3:
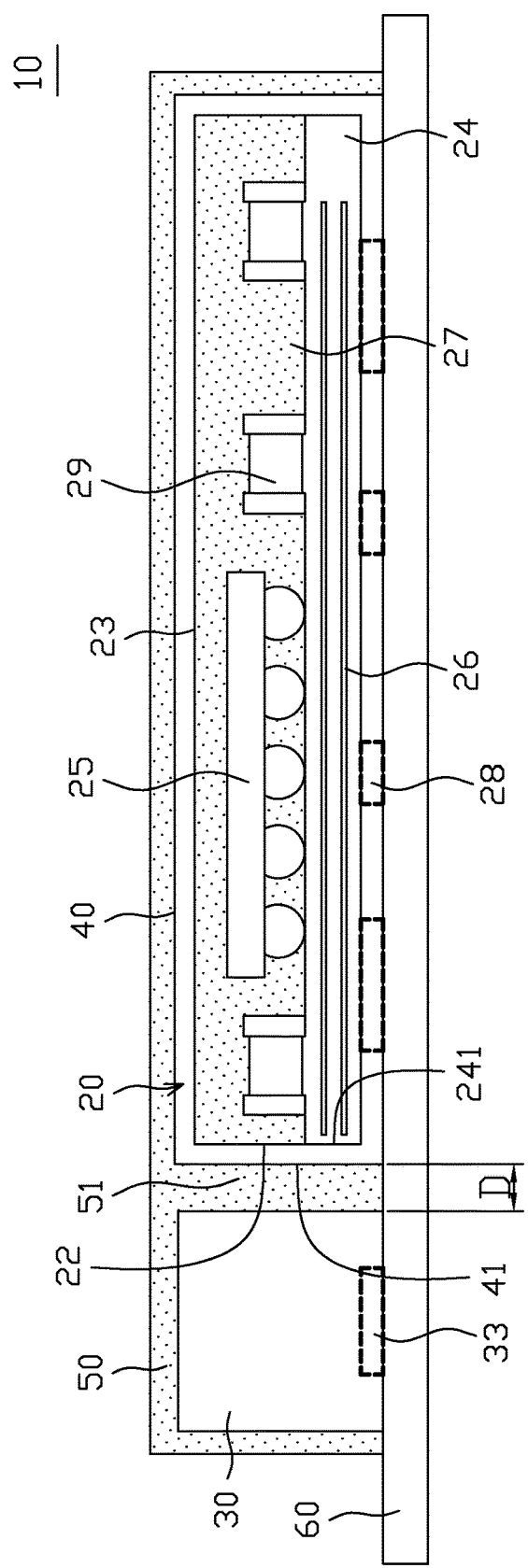
FIG. 3 is a cross-sectional view showing a structure of a semiconductor package disposed on a system board according to the first embodiment of the present invention.

FIG. 3 is a cross-sectional view showing a structure of a semiconductor package disposed on a system board according to the first embodiment of the present invention. As shown in FIG. 1C and FIG. 3, the antenna 30 includes a feeding terminal 33 at a bottom of the antenna 30. The RF module 20 includes a RF terminal 28 at a bottom 21 of the RF module 20, and the RF terminal 28 is connected to the module board 24. In an embodiment, a system board 60 includes a matching circuit, the semiconductor package 10 is disposed on the system board 60, and the antenna 30 on the system board 60 is electronically connected to the matching circuit of the system board 60 by way of the feeding terminal 33. In addition, the antenna 30 is connected to the system board 60 without passing through the EM shield 40 and the module board 24 of the RF module 20. The RF module 20 on the system board 60 is electronically connected to the matching circuit of the system board 60 via the RF terminal 28.

Figure 4:
FIG. 4 is a flowchart showing a method of assembling the semiconductor package according to the first embodiment of the present invention.
Figure 4:
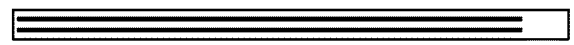
Figure 4:
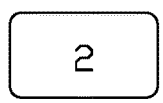
Figure 4:
Figure 4:
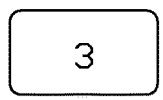
Figure 4:
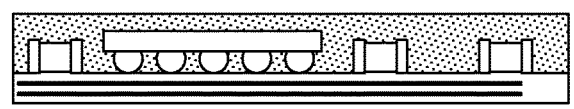
Figure 4:
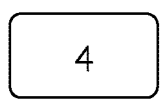
Figure 4:
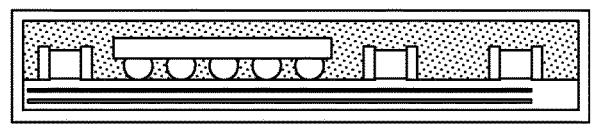
Figure 4:
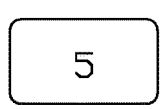
Figure 4:
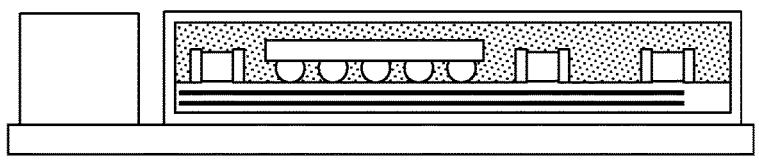
Figure 4:
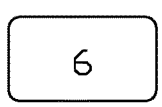
Figure 4:
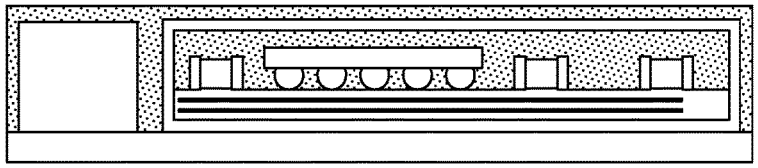
Figure 4:
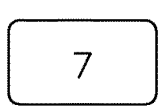
Figure 4:
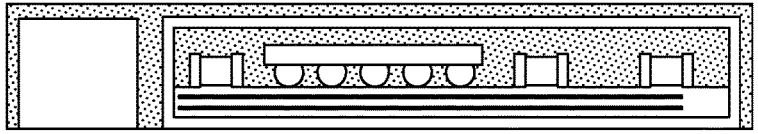

FIG. 4 is a flowchart showing a method of manufacturing the semiconductor package according to the first embodiment of the present invention. The method includes, but not limited to, the following steps:

Step 1: prepare a module board 24;
Step 2: dispose a semiconductor component 25 and at least one SMD component 29 on the module board 24;
Step 3: cover the semiconductor component 25 and the SMD component 29 using a second mold body 27 to form a RF module 20;
Step 4: cover the RF module 20 by an EM shield 40;
Step 5: dispose the RF module 20 and an antenna 30 on a provisional carrier with the EM shield 40 apart from the antenna 30 by a predetermined distance D;
Step 6: connect the antenna 30 and the EM shield 40 on the provisional carrier by a first mold body 50 to fix the predetermined distance D;
Step 7: remove the provisional carrier to form a semiconductor package 10.

In step 1, the module board 24 is prepared for supporting electronic components. In step 2, the semiconductor component 25 and at least one SMD component 29 are disposed on the top side of the module board 24. In step 3, the second mold body 27 covers a top side of the module board 24 including the regions of the semiconductor component 25, the SMD component 29 mounted on the top side of the module board 24. In step 4, the EM shield 40 is formed by a coating process, a printing process, and a photolithography or lithography, and is attached to the second mold body 27, the lateral side 22 of the RF module 20, and even the side surface 241 of the module board 24. In step 5, the provisional carrier is prepared for supporting the antenna 30 and the RF module 20 provisionally, and the antenna 30 is placed at a position at the lateral side 22 of the RF module 20 to define the predetermined distance D. In step 6, a space between the antenna 30 and the EM shield 40 is formed by the predetermined distance D, and the first mold body 50 is put into the space to connect the antenna 30 and the EM shield 40 and fix the predetermined distance D. The first mold body 50 also can cover the antenna 30 and the EM shield 40. In step 7, the provisional carrier is removed from the antenna 30 and the RF module 20, and then the fabrication of the semiconductor package 10 is finished.

Figure 5A:
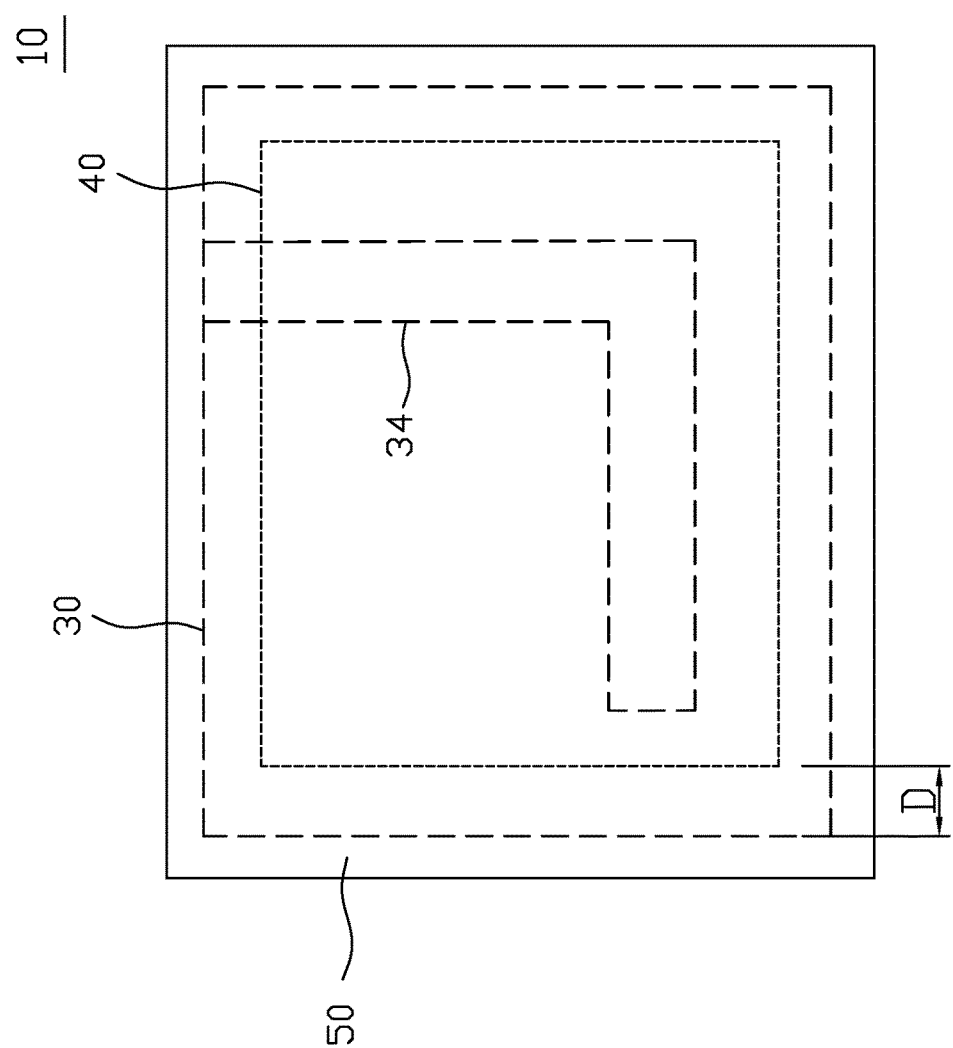
FIG. 5A is a top view showing a structure of a semiconductor package to a second embodiment of the present invention.
Figure 5B:
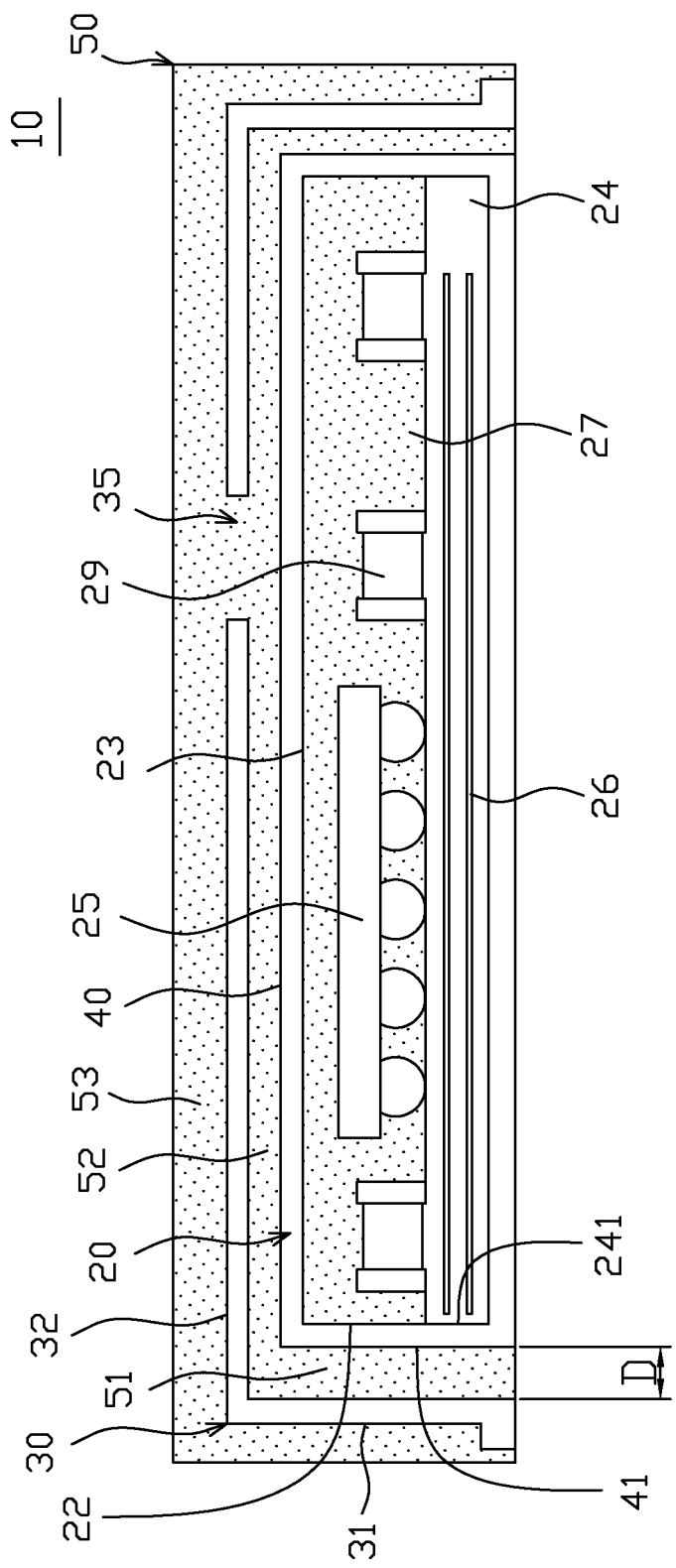
FIG. 5B is a cross-sectional view showing a structure of a semiconductor package according to a second embodiment of the present invention.
Figure 5C:
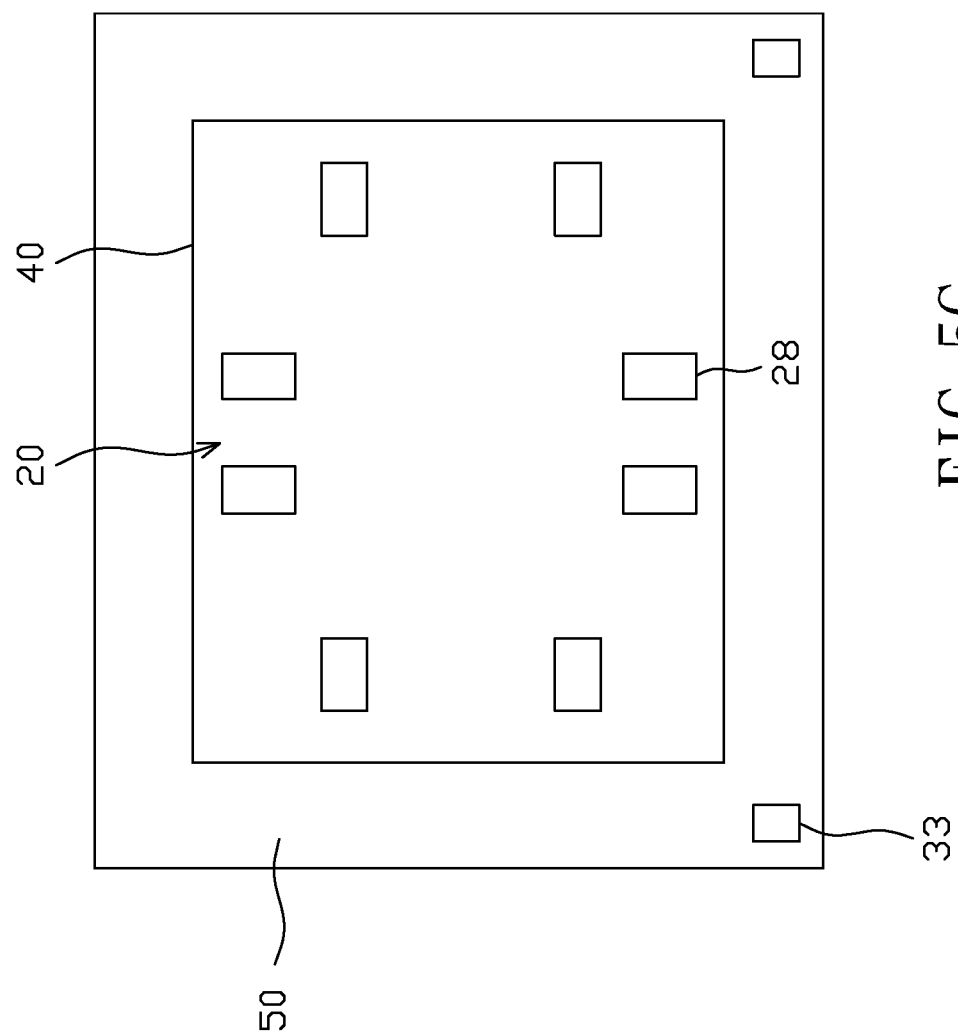
FIG. 5C is a bottom view showing a structure of a semiconductor package to the second embodiment of the present invention.

FIG. 5A is a top view showing a structure of a semiconductor package to a second embodiment of the present invention. FIG. 5B is a cross-sectional view showing a structure of a semiconductor package according to the second embodiment of the present invention. FIG. 5C is a bottom view showing a structure of a semiconductor package to the second embodiment of the present invention. As shown in FIGS. 5A, 5B and 5C, the semiconductor package 10 includes a radio frequency (RF) module, an antenna 30, an electromagnetic (EM) shield 40 and a first mold body 50. In this embodiment, the structures of the RF module 20 and the EM shield 40 are similar to the first embodiment so the detailed descriptions about the structures of the RF module 20 and the EM shield 40 are not given here again.

In this illustrated embodiment, the antenna 30 includes a base portion 31 and a flat portion 32. The base portion 31 of the antenna 30 is at the lateral side 22 of the RF module 20, and the flat portion 32 of the antenna 30 extends from the base portion 31 of the antenna 30 and directly above the RF module 20. In an embodiment, the base portion 31 of the antenna 30 is disposed along the top surface 23 of the RF module 20, and the flat portion 32 of the antenna 30 and the base portion 31 of the antenna 30 form a right angle at a joint of the flat portion 32 of the antenna 30 and the base portion 31 of the antenna 30. Furthermore, in an embodiment, the EM shield 40 is disposed between the flat portion 32 of the antenna 30 and the top surface 23 of the RF module 20, and the EM shield 40 is below the flat portion 32 of the antenna 30 and above the top surface 23 of the RF module 20. The flat portion 32 of the antenna 30 can include a patterned portion 34. In an embodiment, the patterned portion 34 of the antenna 30 can be a monopole type, PFIA type, F-type, U-type or strip line type.

The first mold body 50 fixes the EM shield 40 and the antenna 30 such that the antenna 30 is spaced apart from the side wall 41 of the EM shield 40 by a predetermined distance D. In an embodiment, the first mold body 50 includes an inner portion 52 and an outer portion 53. The inner portion 52 covers the EM shield 40, the outer portion 53 covers the antenna 30, and the antenna 30 is located between the inner portion 52 of the first mold body 50 and the outer portion 53 of the first mold body 50. The inner portion 52 of the first mold body 50 is connected to the outer portion 53 of the first mold body 50 by passing through the flat portion 32 of the antenna 30. More specifically, the flat portion 32 of the antenna 30 includes a hole 35, the inner portion 52 of the first mold body 50 is connected to the outer portion 53 of the first mold body 50 via the hole 35, and the antenna 30 and the EM shield 40 are fixed by the first mold body 50. The predetermined distance D is the distance from the base portion 31 of the antenna 30 to the side wall 41 of the EM shield 40.

Figure 6:
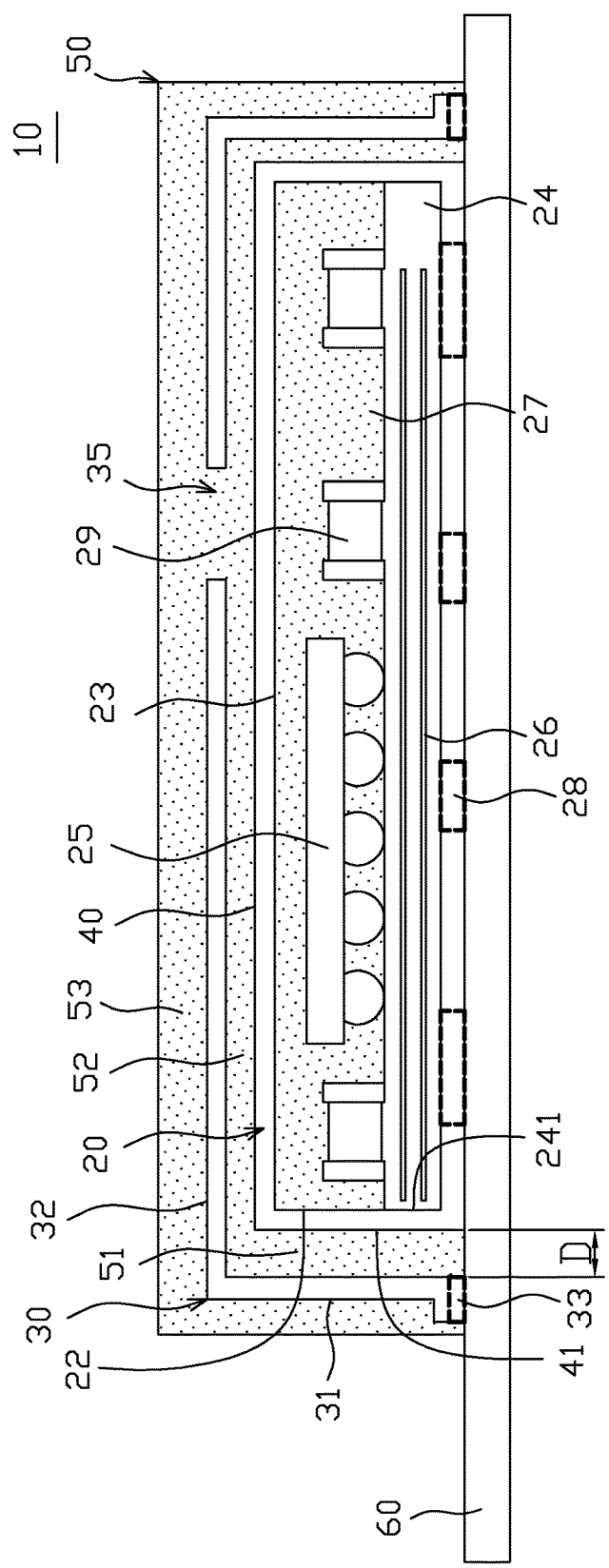
FIG. 6 is a cross-sectional view showing a structure of a semiconductor package disposed on a system board according to the second embodiment of the present invention.

FIG. 6 is a cross-sectional view showing a structure of a semiconductor package disposed on a system board according to the second embodiment of the present invention. As shown in FIG. 5C and FIG. 6, the antenna 30 includes a feeding terminal 33, and the feeding terminal 33 is at a bottom of the base portion 31 of the antenna 30. The RF module 20 includes a RF terminal 28, the RF terminal 28 is at a bottom 21 of the RF module 20, and the RF terminal 28 is connected to the module board 24. In an embodiment, the system board 60 includes a matching circuit, the semiconductor package 10 is disposed on the system board 60, and the antenna 30 on the system board 60 is electronically connected to the matching circuit of the system board 60 via the feeding terminal 33. In addition, the antenna 30 is connected to the system board 60 without passing through the EM shield 40 and the module board 24 of the RF module 20. The RF module 20 on the system board 60 is electronically connected to the matching circuit of the system board 60 via the RF terminal 28.

Figure 7:
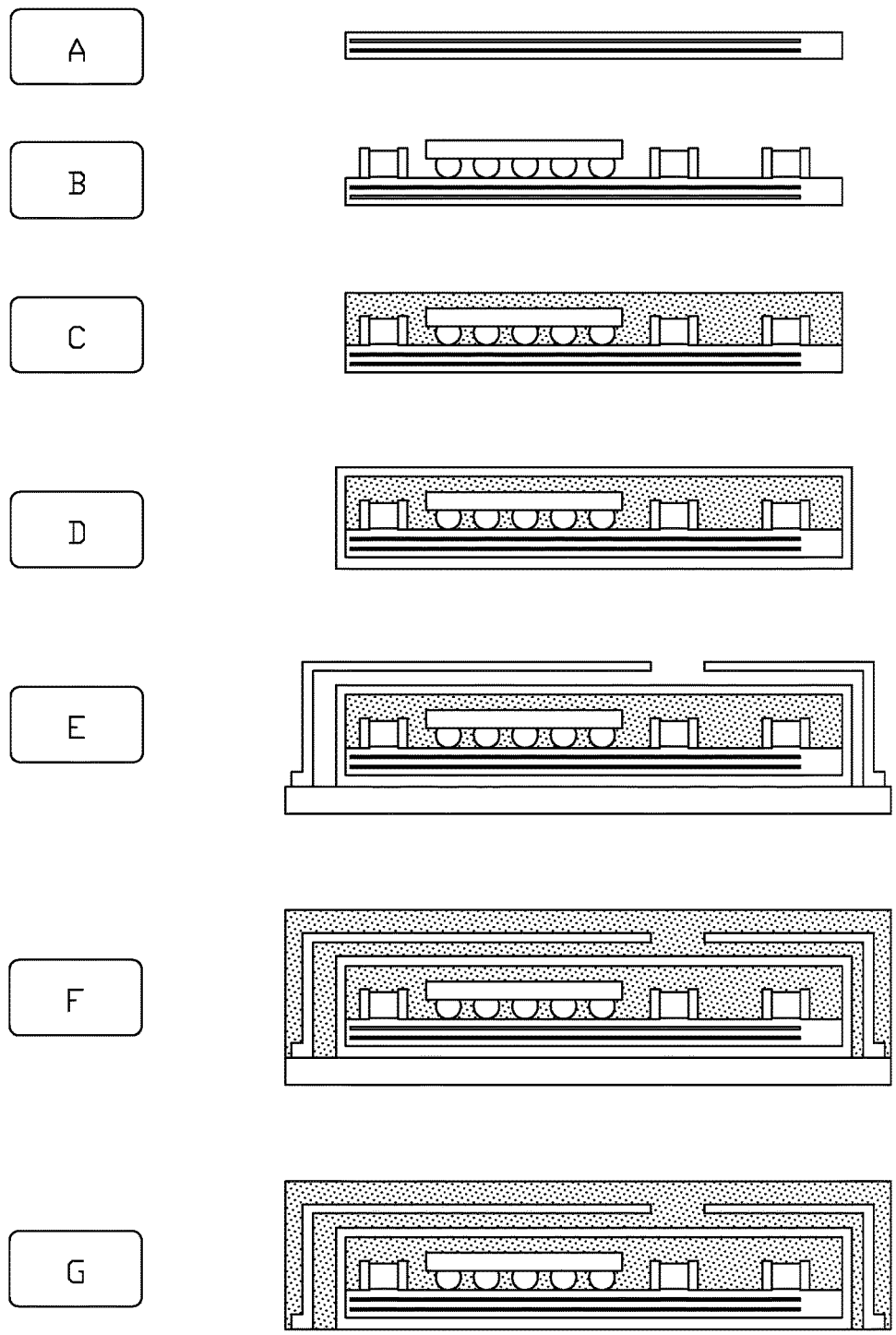
FIG. 7 is a flowchart showing a method of assembling the semiconductor package according to the second embodiment of the present invention.

FIG. 7 is a flowchart showing a method of assembling the semiconductor package according to a second embodiment of the present invention, The method includes but not limited to the following steps:

Step A: prepare a module board 24;
Step B: dispose a semiconductor component 25 and at least one SMD component 29 on the module board 24;
Step C: cover the semiconductor component 25 and the SMD component 29 using a second mold body 27 to form a RF module 20;
Step D: cover the RF module 20 by an EM shield 40;
Step E: dispose the RF module 20 and an antenna 30 on a provisional carrier with the EM shield 40 apart from the antenna 30 by a predetermined distance D;
Step F: connect the antenna 30 and the EM shield 40 on the provisional carrier by a first mold body 50 to fix the predetermined distance D;
Step G: remove the provisional carrier to form a semiconductor package 10.

Steps A-D are similar to steps 1-4 in the first embodiment so the detailed descriptions are not given here again. In step E, the provisional carrier is prepared for supporting the antenna 30 and the RF module 20 provisionally, and the base portion 31 of the antenna 30 is placed at a position at the lateral of the RF module 20 and the flat portion 32 of the antenna 30 is placed above the top surface 23 of the RF module 20. The predetermined distance D is the distance from the base portion 31 of the antenna 30 to the side wall 41 of the EM shield 40. In step F, a space between the antenna 30 and the EM shield 40 is formed by the predetermined distance D, and the first mold body 50 is put into the space to connect the antenna 30 and the EM shield 40 and fix the predetermined distance D. For example, a first mold material is put via the hole 35 of the flat portion 32 of the antenna 30, and the space between the base portion 31 of the antenna 30 and the side wall 41 of the EM shield 40 and between the flat portion 32 of the antenna 30 and the top surface 23 of the EM shield 40 is stuffed with the first mold material to form the inner portion 52 of the first mold body 50. After that, a side of the base portion 31 of the antenna 30 facing away from the EM shield 40 and a side of the flat portion 32 of the antenna 30 facing away from the EM shield 40 are coated with the first mold material to form the outer portion 53 of the first mold body 50. Thus, the antenna 30 and the EM shield 40 are connected by the first mold body 50, and the predetermined distance D is fixed. In step G, the provisional carrier is removed from the antenna 30 and the RF module 20, and the fabrication of the semiconductor package 10 is finished.

In summary, the advantages of the present invention are as follows:

1. The antenna and the RF module are packaged together, so that the semiconductor package acts as a package component and can be applied to a system board of a variety of wireless communication devices, such as a wearable point-of-sale (POS) terminal or portable barcode scanner. In other words, it is easy to be mounted on the system board because the first mold body connects the antenna and the EM shield to form a semiconductor package directly.

2. The first mold body fixes the relative location of the antenna and the EM shield to control the predetermined distance between the antenna and the EM shield. This simplifies the impedance matching between the antenna and the RF module because the distance variation between the antenna and the EM shield is eliminated.

3. The LO leakage of the semiconductor package due to the antenna can be controlled precisely by adjusting the predetermined distance between the antenna and the EM shield.

4. The effect on antenna radiation pattern can be reduced by fixing the antenna at the lateral side of the RF module with the first mold body.

5. The EM shield can cover the side surface of the module board to have a better shielding effect.

6. The antenna can connect the system board without passing through the EM shield and the module board. Thus, the EM shield has a better shielding effect.

7. The EM shield can be attached to the first mold body closely by a coating process to have a better shielding effect.

8. The antenna can connect the system board without passing through the module board. This simplifies the impedance matching between the antenna and the RF module because the impedance of a connecting wire from the antenna through the module board is eliminated and does not have to be considered.

9. The antenna can connect the system board without passing through the module board. This allows more space/height to arrange the antenna.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor package, comprising:
   a radio frequency (RF) module having a bottom and a lateral side, wherein the RF module includes a module board at the bottom;
   an antenna located at the lateral side of the RF module;
   an electromagnetic (EM) shield covering the RF module, wherein the EM shield includes a side wall disposed along the lateral side of the RF module, and the side wall of the EM shield is between the RF module and the antenna; and
   a first mold body fixing the EM shield and the antenna such that the antenna is entirely spaced apart from the EM shield and the module board by a respective predetermined distance.

2. The semiconductor package according to claim 1, wherein the module board includes a side surface along the lateral side of the RF module, and the EM shield extending to the module board covers the side surface of the module board.

3. The semiconductor package according to claim 2, wherein the RF module comprises a semiconductor component disposed on the module board and a second mold body disposed on the module board, and the second mold body covers the semiconductor component.

4. The semiconductor package according to claim 2, wherein the RF module comprises a ground layer, and the EM shield is electronically connected to the ground layer via the side surface of the module board.

5. The semiconductor package according to claim 1, wherein the first mold body comprises a spacer located between the antenna and the side wall of the EM shield such that the antenna is spaced apart from the side wall of the EM shield by the spacer, and the spacer defines the predetermined distance.

6. The semiconductor package according to claim 5, wherein the antenna and the RF module do not overlap with each other at the lateral side of the RF module from a top view of the semiconductor package.

7. The semiconductor package according to claim 6, wherein the RF module comprises a top surface, and the EM shield covers the top surface of the RF module.

8. The semiconductor package according to claim 6, wherein the first mold body covers the RF module.

9. The semiconductor package according to claim 6, wherein the first mold body covers the antenna.

10. The semiconductor package according to claim 1, wherein the antenna comprises a feeding terminal, and the RF module comprises a RF terminal for electronically connected to a matching circuit of a system board respectively.

11. The semiconductor package according to claim 10, wherein the antenna is connected to the feeding terminal for connecting the system board without passing through the module board.

12. The semiconductor package according to claim 10, wherein the antenna is connected to the feeding terminal for connecting the system board without passing through the EM shield.

13. The semiconductor package according to claim 1, wherein the first mold body encapsulates a lateral side of the module board.

14. The semiconductor package according to claim 13, wherein the EM shield covers at least one portion of the lateral side of the module board.

15. A semiconductor package, comprising:
    a radio frequency (RF) module having a bottom and a lateral side, wherein the RF module includes a module board at the bottom;
    an antenna located at the lateral side of the RF module;
    an electromagnetic (EM) shield covering the RF module, wherein the EM shield includes a side wall disposed along the lateral side of the RF module, and the side wall of the EM shield is between the RF module and the antenna; and
    a first mold body fixing the EM shield and the antenna such that the antenna is spaced apart from the side wall of the EM shield by a predetermined distance,
    wherein the first mold body comprises a spacer located between the antenna and the side wall of the EM shield such that the antenna is spaced apart from the side wall of the EM shield by the spacer, and the spacer defines the predetermined distance, and
    wherein the antenna comprises a base portion at the lateral side of the RF module and a flat portion extending from the base portion of the antenna and directly above the RF module.

16. The semiconductor package according to claim 15, wherein the RF module comprises a top surface, the flat portion of the antenna is disposed along the top surface of the RF module, the EM shield is disposed between the flat portion of the antenna and the top surface, and the EM shield is below the flat portion of the antenna and above the top surface of the RF module.

17. The semiconductor package according to claim 15, wherein the base portion of the antenna is disposed along the lateral side of the RF module, and the EM shield is disposed between the base portion of the antenna and the lateral side of the RF module.

18. The semiconductor package according to claim 15, wherein the first mold body comprises an inner portion covering the EM shield and an outer portion covering the antenna, and the outer portion of the first mold body is connected to the inner portion with a pass through in the flat portion of the antenna.

19. The semiconductor package according to claim 15, wherein the flat portion of the antenna and the base portion of the antenna form a right angle at a joint of the flat portion of the antenna and the base portion of the antenna.

* * * * *